United States Patent [19]

Houlihan et al.

[11] Patent Number: 5,998,099
[45] Date of Patent: Dec. 7, 1999

[54] ENERGY-SENSITIVE RESIST MATERIAL AND A PROCESS FOR DEVICE FABRICATION USING AN ENERGY-SENSITIVE RESIST MATERIAL

[75] Inventors: Francis Michael Houlihan, Millington; Omkaram Nalamasu, Basking Ridge, both of N.J.; Thomas Ingolf Wallow, Union City, Calif.

[73] Assignee: Lucent Technologies Inc., Murray Hill, N.J.

[21] Appl. No.: 09/083,168

[22] Filed: May 22, 1998

Related U.S. Application Data

[63] Continuation-in-part of application No. 08/813,732, Mar. 7, 1997, Pat. No. 5,879,857, which is a continuation-in-part of application No. 08/803,703, Feb. 21, 1997, Pat. No. 5,843,624
[60] Provisional application No. 60/060,869, Oct. 2, 1997, and provisional application No. 60/013,093, Mar. 8, 1996.

[51] Int. Cl.$^6$ ...................................................... G03C 5/00
[52] U.S. Cl. ........................ 430/311; 430/325; 430/270.1; 430/910; 430/914; 430/919; 430/920; 522/31; 522/57
[58] Field of Search ..................................... 430/910, 914, 430/919, 921, 325, 270.1, 311; 522/31, 57

[56] References Cited

U.S. PATENT DOCUMENTS

| | | | |
|---|---|---|---|
| 4,437,836 | 3/1984 | Schmitz-Josten et al. | 433/199 |
| 4,734,444 | 3/1988 | Henne et al. | 522/24 |
| 5,066,566 | 11/1991 | Novembre | 430/296 |
| 5,310,619 | 5/1994 | Crivello et al. | 430/270 |
| 5,583,195 | 12/1996 | Eckberg | 528/26 |
| 5,882,842 | 3/1999 | Akaki et al. | 430/280.1 |

OTHER PUBLICATIONS

McGraw–Hill Publishing Company, "VLSI Technology", Second Edition, S.M. Sze, 1983.
"SPIE" Recent Advances in 193 NM Single–Layer Photoresists Based on Alternating Copolymers of Cycloolefins, Houlihan et al., vol. 3049, pp. 84–91, 1997.

"SPIE" An Overview of Photoacid Generator Design For Acetal Resist Systems, Houlihan et al., vol. 3049, pp. 466–472, 1997.

*Microelectronics Technology,* "Design Considerations for 193–nm Positive Resists", Allen et al., Chapter 17, pp. 255–270, Sep. 15, 1995.

"American Chemical Society Symposium Series", Thompson et al., 219, *Introduction to Microlithography,* pp. 88–159, 1983.

"SPIE", Protecting Groups for 193–nm Photoresists, Allen et al., vol. 2724, pp. 334–343, 1996.

"SPIE", Structural Design of Ketal and Acetal Blocking Groups in 2–Component Chemically Amplified Positive DUV–Resists, Mertesdorf et al., vol. 2438, pp. 84–98, 1996.

*Primary Examiner*—Janet Baxter
*Assistant Examiner*—Rosemary Ashton
*Attorney, Agent, or Firm*—Richard J. Botos

[57] ABSTRACT

A process for device fabrication and resist materials that are used in the process are disclosed. The resist material contains a substituted amine-containing component and a polymer. The substituted-amine containing component is either a photoacid generator, or an amine additive to the resist material that also contains a photoacid generator. The resist material contains acid labile groups either pendant to the polymer or to a dissolution inhibitor that is combined with the polymer. The acid labile groups significantly decrease the solubility of the polymer in a solution of aqueous base. A film of the resist material is formed on a substrate and exposed to delineating radiation. The radiation induces a chemical change in the resist material rendering the exposed resist material substantially more soluble in aqueous base solution than the unexposed portion of the resist material. The image introduced into the resist material is developed using conventional techniques, and the resulting pattern is then transferred into the underlying substrate.

24 Claims, No Drawings

ENERGY-SENSITIVE RESIST MATERIAL AND A PROCESS FOR DEVICE FABRICATION USING AN ENERGY-SENSITIVE RESIST MATERIAL

CONTINUING APPLICATION DATA

This application claims the benefit of U.S. Provisional Application No. 60/060869 filed Oct. 2, 1997 and is a continuation-in-part of U.S. aplication Ser. No. 08/813,732 filed Mar. 7, 1997, now U.S. Pat. No. 5,879,857, which is a continuation-in-part of U.S. application Ser. No. 08/803,703 filed Feb. 21, 1997, now U.S. Pat. No. 5,843,624, which claims the benefit of U.S. Provisional Application No. 60/013,093 filed Mar. 8, 1996.

BACKGROUND OF THE INVENTION

1. Technical Field

The invention is directed to a process for device fabrication in which an energy sensitive resist material is used.

2. Art Background

Devices such as integrated circuits are complex structures made of a variety of materials. These materials are precisely configured to form the desired device by a variety of processes. A lithographic process is frequently used to transfer the desired configuration into a substrate to fabricate such devices.

Lithographic processes use intermediate materials frequently referred to as resists. A positive or negative image of the desired configuration is first introduced into the resist by exposing it to patterned radiation which induces a chemical change in the exposed portions of the resist. This chemical change is then exploited to develop a pattern in the resist, which is then transferred into the substrate underlying the resist.

The efficacy of a lithographic process depends at least in part on the resist used to transfer the pattern into the substrate. Certain types of resists offer particular advantages in the context of specific lithographic processes. For example, solution-developed resists are designed to have absorption characteristics appropriate for use at certain exposure wavelengths. It is axiomatic that, if the resist material is opaque to the exposing radiation, the exposing radiation will not be transmitted into the resist material and the desired chemical change will not occur. Therefore it is important to select a resist material that has the appropriate light transmission characteristics at the wavelength of the exposing radiation. Other considerations that drive the selection of an appropriate resist material include the etch resistance of the resist after it has been exposed and developed.

A variety of resist materials are employed in lithographic processes for device fabrication. One class of resist materials contains a polymer which has certain functional groups (e.g. alcohol (OH); phenol ($C_2H_5OH$); carboxylic acid (COOH); etc.). A certain portion of these functional groups are "masked," i.e., the hydrogen atom is removed and replaced by moieties referred to as protecting groups. These protecting groups are removable from the polymer by acidolysis or hydrolysis. A polymer with a significant number of these protecting groups has a very different solubility in developer solutions (typically aqueous base solutions) than a polymer with substantially fewer of these protecting groups. Examples of protecting groups include acetals, ketals, bis(trimethylsilylmethyl)methyloxy, t-butoxycarbonyloxy, t-butyl esters, and t-butyl ethers which are cleavable from the functional groups by acidolysis or hydrolysis. The functional groups from which the protecting groups have been cleaved are referred to as unmasked functional groups.

The resist materials also contain an energy-sensitive material in combination with the polymer. When exposed to a certain energy (energy of a particular wavelength (e.g. 248 nm) or type (electron beam)) a moiety is generated from the energy-sensitive material which effects the cleavage of the protecting group, thereby "unmasking" the functional group. When the protecting group is an acid labile group, i.e. it is removed in the presence of acid, the energy sensitive material is typically a photoacid generator (PAG). The greater the number of protecting groups that are cleaved from the polymer, the greater the chemical contrast between the polymer exposed to radiation and the polymer not exposed to radiation. This chemical contrast between the unexposed resist material and the exposed resist material is exploited to develop a pattern in the resist material.

The chemical contrast is typically a difference between the solubility of the exposed resist compared to that of the unexposed resist in a developer solution. The developer solution is typically an aqueous base solution. Ideally, all of the resist material in one area (the exposed area in a positive resist, the unexposed area in a negative resist) is removed and the resist material in the other area remains. In positive resists in which the basis for contrast is the relative solubility of the exposed and unexposed resist in developer solution, however, there is a tendency for the moiety that effects deprotection to diffuse from the exposed resist into the unexposed resist. Such diffusion, if significant enough, will erode the developed features. The result is features that do not have the desired dimensions. This problem is exacerbated the longer the time that elapses between exposure and development, because, over time more of the moiety that effects deprotection diffuses into the unexposed region.

In integrated circuit devices, feature sizes are decreasing (0.35 $\mu$m to 0.25 $\mu$m to 0.18 $\mu$m, etc.) in order to increase the number of semiconductor devices that can be formed on an integrated circuit chip. As feature size decreases, the amount of feature erosion that is acceptable also decreases. Therefore solution-developed resist materials are sought that reduce the degree to which features are eroded during imaging and development.

SUMMARY OF THE INVENTION

The present invention is directed to a lithographic process for device fabrication which utilizes an energy sensitive resist material that contains either a polymer with acid labile substituents pendant thereto or a polymer and a dissolution inhibitor with acid labile substituents pendant thereto combined with a substituted amino-containing component. In one embodiment of the present invention the substituted amino-containing component is a substituted amino-containing photoacid generator (PAG). In this embodiment, the amino-containing component is photoactive (i.e. it generates a photoacid when exposed to radiation of a certain wavelength) and the photoacid so generated has a p$K_a$ in the range of about 0 to about 6. It is advantageous if the photoacid so generated has a p$K_a$ in the range of about 0 to about 4.

In a second embodiment of the present invention, the resist material contains a polymer combined with the substituted amino-containing component and another PAG. In this embodiment, the amino-containing compound is either photoactive or not photoactive. If photoactive, the photoacid generated by exposing the amino-containing component to radiation is not sufficiently strong to remove a significant number of acid labile groups from the polymer. If not photoactive, acid is not generated when the amino-containing component is exposed to radiation. Whether photoactive or not photoactive, the amino-containing compound of the present invention is sufficiently basic (prior to exposure to radiation in the photoactive embodiments) to limit the diffusion of acid in the resist material and to buffer the resist to reduce the adverse effect of airborne contamination thereon.

The substituted amino-containing compound has the following general structure:

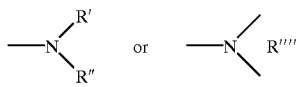

wherein Y is a nitrogen-containing moiety that is either

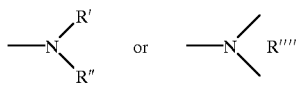

wherein R', R", R''' and R'''' are selected so that the $pK_a$ of the photoacid generated when the resist material is exposed to radiation is less than or equal to the $pK_a$ of the conjugate acid formed by the reaction of a proton (H+) with the amino moiety —R'''—Y. Such a relationship ensures that the amino-containing compound acts as a base in relation to the released photoacid, thereby limiting acid diffusion and reducing erosion of the developed features. In the amino-containing compound of the present invention, R' and R" are the same or different and both are either hydrogen (H), alkyl groups with about 8 or fewer carbon atoms, (e.g. methyl groups, ethyl groups, tert-butyl groups), cycloalkyl (e.g., cyclohexyl, cyclopentyl), phenyl, and alkyl ethers. Suitable alkyl ethers have the following formula:

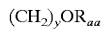

where y is equal to about 2 or 3 and $R_{aa}$ is either an alkyl group with 5 or fewer carbon atoms or a cycloalkyl group. It is advantageous if one of R' and R" is H. Also, if one of R' or R" is phenyl, the other is not. This is because the number of phenyl moieties in the substituted amino-containing compound is limited to one. R'''' is an alkylene moiety with at least about three but no more than about eight carbon atoms.

The number n in the above formulation is either zero (in which case R" is not present in the formulation) or 1. R''' is either an alkylene moiety with eight or fewer carbon atoms or a phenylene moiety. As previously noted, the number of phenyl or phenylene moieties in the substituted amino-containing compound of the present invention is limited to one. The alkylene and phenylene moieties are either substituted or unsubstituted. If substituted, suitable substituents include alkyl, cycloalkyl, alkylcarbonyl, carboxyl, carboxyl ester, perfluorinated alkyl and sulfonyl.

In the embodiments of the present invention wherein the substituted amino-containing compound is a PAG (i.e. the generated photoacid is strong enough to cleave the acid labile substituents from the polymer or dissolution inhibitor), X is a chromophore moiety such as, for example, bis(t-butyl phenyl) iodonium, tris (t-butyl phenyl) sulfonium, or 2-trifluoromethyl 6-nitrobenzyl. In these embodiments R', R", R''', and R'''' are selected so that the amino moiety, —R'''—Y, is a sufficiently weak enough base so that the photoacid that is formed when X is cleaved from the aminosulfonate moiety by the exposing radiation has a $pK_a$ of about 0 to about 6 and, advantageously, about 0 to about 4. In these embodiments R''' is either a methylene moiety, an ethylene moiety or a phenylene moiety that is either unsubstituted or substituted as previously described.

In the embodiments of the present invention wherein the substituted amino-containing compound is photoactive but does not function as the PAG (i.e. the generated acid is not strong enough to cleave significant numbers of the acid labile substituents from the polymer or dissolution inhibitor), X is a chromophore moiety such as, for example, bis(t-butyl phenyl) iodonium, tris (t-butyl phenyl) sulfonium, or 2-trifluoromethyl 6-nitrobenzyl. However, in these embodiments R', R", R''', and R'''' are selected so that the amino moiety, -R'''-Y, is a sufficiently strong enough base to neutralize the photoacid generated from the other PAG in the resist material. Also, in these embodiments, the basicity of the amino moiety is neutralized when the amino-containing compound undergoes photolysis (i.e. the aminosulfonate moiety is cleaved from the chromophore moiety).

In the embodiments of the present invention wherein the substituted amino-containing compound is not photoactive and not a PAG, X is a positively charged onium cation such as, for example, ammonium or dicyclohexylammonium that does not decompose (i.e. separate from the aminosulfonate moiety) at either the operating temperature of the resist or at the wavelength of the exposing radiation.

Because the acidic moiety generated by the substituted amino-containing PAG has a $pK_a$ greater than about zero (as measured in water), the acidic moiety will not significantly cleave acid labile moieties that have a high activation energy. In the context of the present invention, an acid labile group with a high activation energy is an acid labile group that is cleaved by an acidic moiety with a $pK_a$ of less than zero. Examples of acid labile groups with a high activation energy are tert-butoxycarbonyl, and tert-butyl.

In the embodiment wherein the acid labile groups have a high activation energy, the resist material contains the substituted amino-containing PAG in combination with another PAG that generates an acidic moiety with a sufficiently low $pK_a$ to cleave the high activation energy groups from the polymer or dissolution inhibitor. Examples of PAGs that generate an acid with a suitably low $pK_a$ are the perfluorinated alkyl sulfonate PAGs described in U.S. Ser. No. 08/803,703 now U.S. Pat. No. 5,843,624 filed on Mar. 8, 1996 to Houlihan et al., which is incorporated by reference. In an alternative embodiment, the substituted amino-containing component is not a PAG.

In the embodiment of the present invention wherein the resist material contains a polymer with low activation energy acid labile groups pendant thereto, the amount of polymer in the resist material is about 80 weight percent to about 99.5 weight percent and the amount of substituted amino-containing PAG in the composition is about 0.5 weight percent to about 20 weight percent (based on the combined weight of polymer plus PAG). In one of the embodiments of the present invention wherein the wavelength of the exposing radiation (i.e. the wavelength is less than 200 nm) mandates that the amount of unsaturated carbon bonds in the resist be limited, the amount of polymer is about 96 weight percent to about 99.5 weight percent and the amount of PAG is about 0.5 weight percent to about 4 weight percent.

The resist material optionally contains other amine additives in addition to the substituted amino-containing PAG.

Examples of these other amine additives include the non-PAG substituted amino-containing component described above and other known substituted amino-containing additives such as triphenylimidazole (TPI). The other amine additives, if present, are present in an amount of about 0.1 weight percent to about 0.8 weight percent of the combined weight of the polymer and the PAG.

In a further embodiment of the present invention, the resist material contains a polymer that is inherently soluble in the developer solution in combination with a dissolution inhibitor that has the acid labile groups pendant groups thereto. Examples of suitable inherently soluble polymers include vinyl addition polymers without the acid labile groups pendant thereto. The dissolution inhibitor is either monomeric, polymeric, oligomeric, or mixtures thereof. Examples of suitable monomeric dissolution inhibitors are described in U.S. Pat. No. 5,310,619 to Crivello et al., which is hereby incorporated by reference. Examples of suitable oligomeric dissolution inhibitors are described in U.S. Ser. No. 08/813,732 now U.S. Pat. No. 5,879,857 to Chandross et al, which was filed on Mar. 7, 1997 and is incorporated by reference herein.

In the embodiment of the present invention wherein the resist material contains a polymer with a high activation energy acid labile groups pendant thereto, the amount of polymer in the resist material is about 96 weight percent to about 99.5 weight percent and the amount of PAG in the composition is about 0.5 weight percent to about 4 weight percent (based on the combined weight of polymer plus PAG). The resist material also contains either the photoactive substituted amino-containing compound, the non-photoactive substituted amino-containing compound, the substituted amino-containing PAG, or a combination thereof. The total amount of the substituted amino-containing component of the resist material in this embodiment is about 0.1 weight percent to about 0.8 weight percent of the combined weight of the polymer and the PAG.

In the embodiment of the present invention wherein the resist material contains a polymer in combination with a dissolution inhibitor, the amount of polymer relative to the amount of dissolution inhibitor is about 60 weight percent to about 90 weight percent polymer to about 10 weight percent to about 40 weight percent dissolution inhibitor.

In the process of the present invention, generally, the resist material containing the components described generally above is formed into a film on the surface of a substrate that is typically a silicon wafer. The silicon wafer will typically have layers of other materials formed thereon. These wafers, with or without layers of other materials formed thereon, are referred to herein as substrates.

The resist-coated substrate is then subjected to a patternwise exposure to radiation to delineate the image of a pattern into the energy-sensitive resist material. A chemical agent, the photoacid generated in the course of the irradiation, effects a chemical change (typically upon heating), which enhances the aqueous base solubility of the irradiated portion of the resist. The resist materials of the present invention are contemplated as useful in lithographic processes in which the exposing radiation is ultraviolet (UV) radiation with a wavelength of about 190 nm to about 370 nm.

After the image of the pattern is delineated in the resist material, the image is developed into a pattern by exploiting the difference in aqueous base solubility between the exposed resist material and the unexposed resist material. In the context of the present invention, the term "exposed resist material" implies the portion of the resist whose aqueous base solubility has been increased by exposure to the photoacid and, typically, heat.

After the development, the pattern in the resist is transferred into the underlying substrate using conventional etching expedients well known to one skilled in the art.

DETAILED DESCRIPTION

The present invention is directed to a class of energy-sensitive resist materials that are useful in lithographic processes for device fabrication. Processes for device fabrication which include lithographic steps have been described in treatises such as S. M. Sze, *VLSI Technology*, (McGraw-Hill pub., 1983) and L. F. Thompson et al., *Introduction to Microlithography*, pp. 87–161 (American Chemical Society Symposium Series 219, 1983) which are hereby incorporated by reference. Lithographic steps typically include exposing and patterning energy definable materials such as resist materials. An image is first introduced into the resist and developed to form a pattern, which is then transferred into the substrate.

The materials are energy-sensitive; i.e., energy induces a chemical change in these materials. When these materials are exposed to either patterned radiation of the appropriate wavelength, i.e., UV light with a wavelength of about 190 nm to about 370 nm, the chemical change is induced to a significantly greater extent in the portion of the resist material that is directly exposed to radiation than in the portion of the resist material that is not directly exposed to radiation. In the context of the present invention, significantly greater means that the chemical contrast induced by the patternwise exposure is adequate to meet processing objectives. This chemical difference is exploited to develop the pattern in the energy-sensitive resist material. The developed pattern is then used in subsequent processing, e.g., transfer of the developed pattern into an underlying substrate.

Aqueous base solutions are typically used to develop patterns in energy sensitive resist materials. One common example of an aqueous base solution is an aqueous solution of tetramethylammonium-hydroxide (TMAH) that is about 0.05M to about 0.5M, although many other solutions are well known to one skilled in the art.

In the positive-tone resist materials of the present invention, the material that is not exposed to radiation is relatively insoluble in the aqueous base developer solution relative to the material that is exposed to radiation. This difference in aqueous base solubility is effected by manipulating the aqueous base solubility of a constituent of the energy-sensitive resist material. That constituent is either the resist polymer with acid-labile substituents thereon, a dissolution inhibitor with acid-labile substituents thereon, or a combination thereof.

The polymer or dissolution inhibitor has recurrent pendant groups that undergo efficient acidolysis which results in a significant change in the solubility of the polymer in the developer solution. It is advantageous if the polymer is a vinylic polymer. The polymers useful in the process of the present invention are not limited to polymers that are formed by vinylic addition polymerization, however. Other polymerizations such as condensation, polyaddition, and addition condensation are useful mechanisms for producing suitable polymers. In alternative embodiments, the recurrent pendant groups are not pendant to the polymer, but are pendant to a monomeric, polymeric, oligomeric dissolution inhibitor (or mixtures thereof) combined with a polymer that is inherently soluble in the developer solution used to develop patterns in the resist material.

Examples of suitable pendant groups include acid labile groups such as acetal groups, ketal groups, beta-silicon substituted alkyls such as bis(trimethylsilylmethyl)methyl and 1-(trimethylsilylmethyl)methyl, tert-butyl esters, tert-butyl esters of carboxylic acids, and tert-butyl ethers. For convenience, "tert" is shortened to "t" hereinafter. However, it is understood that a wide range of acid labile groups are operative in the invention.

Examples of suitable polymers with these acid labile groups include acrylate-based polymers and copolymers, methacrylate-based polymers and copolymers, copolymers with alicylic moieties (e.g. norbornene) either incorporated into the polymer backbone or pendant to the polymer backbone. Examples of these polymers include tetra polymers such as poly(cycloolefin-alt-maleic anhydride-co-t-butyl acrylate-co-acrylic acid) wherein the cycloolefin is, for example, norbornene, 5,6-dihydrodicyclopentadiene, 1,5-cyclooctadiene, and 1,5-dimethyl-1,5-cyclooctadiene. Other suitable polymers include the copolymers of poly (norbornene methacrylate-t-butyl ester) which are described in Allen. R. D., et al. "Protecting Groups for 193-nm Photoresists" *Proc. SPIE*, Vol. 2724, p. 341 (1996), which is hereby incorporated by reference. Another example of a suitable polymer is the tetrapolymer of poly(isobornyl methacrylate-co-methyl methacrylate-co-t-butylmethacrylate-co-acrylic acid) described in Allen, R. D., et al. "Design Considerations for 193-nm Positive Resists" *ACS Symposium Series*, Vol. 614, chap. 17, p. 255 (1995) which is hereby incorporated by reference. These polymers are particularly usefull when the exposing radiation is less than about 200 nm (e.g. 193 nm). Since these polymers do not contain aromatic moieties, the light absorption of the polymers at these wavelength is less than polymers with aromatic substituents (e.g. polymers and copolymers of hydroxystyrene wherein a portion of the hydroxyl substituents are replaced by acid labile groups). Resist polymers with aromatic substituents are contemplated as suitable in the present invention when the wavelength of the exposing radiation is greater than about 205 nm (e.g. 248 nm).

The resist material also contains a substituted amino-containing component. The substituted amino-containing component is at least one substituted amino-containing compound. The substituted amino-containing compound has the following general structure:

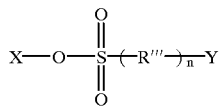

wherein Y is a nitrogen-containing moiety that is either

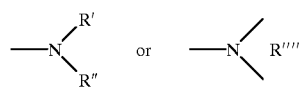

wherein R' and R" are the same or different and both are either hydrogen (H), alkyl groups with about 8 or fewer carbon atoms, (e.g. methyl groups, ethyl groups, tert-butyl groups), cycloalkyl (e.g., cyclohexyl, cyclopentyl), phenyl, and alkyl ethers. Suitable alkyl ethers have the following formula:

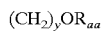

where y is equal to about 2 or 3 and $R_{aa}$ is either an alkyl group with 5 or fewer carbon atoms or a cycloalkyl group.

It is advantageous if one of R' and R" is H. Also, if one of R' or R" is phenyl, the other is not. This is because the number of phenyl moieties in the substituted amino-containing compound is limited to one. R"" is an alkylene moiety with at least about three but no more than about eight carbon atoms.

The number n in the above formulation is either zero (in which case R'" is not present in the formulation) or 1. R'" is either an alkylene moiety with eight or fewer carbon atoms or a phenylene moiety. As previously noted, the number of phenyl or phenylene moieties in the substituted amino-containing compound of the present invention is limited to one. The alkylene and phenylene moieties are either substituted or unsubstituted. If substituted, suitable substituents include alkyl, cycloalkyl, alkylcarbonyl, carboxyl, carboxyl ester, perfluorinated alkyl and sulfonyl.

In the embodiments of the present invention wherein the substituted amino-containing compound is a PAG (i.e., when the substituted amino-containing compound is exposed to radiation, the acid generated is strong enough to cleave the acid labile substituents from the polymer or dissolution inhibitor) X is a chromophore moiety such as, for example, bis(t-butyl phenyl) iodonium, tris (t-butyl phenyl) sulfonium, or 2-trifluoromethyl 6-nitrobenzyl. Also, in these embodiments of R'" is either a methylene moiety, an ethylene moiety or a phenylene moiety that is either substituted or unsubstituted as previously described.

In the embodiments of the present invention wherein the substituted amino-containing compound is photoactive but not a PAG (i.e. when the amino-containing compound is exposed to radiation, the acid generated is not strong enough to cleave a significant number of the acid labile substituents from the polymer or the dissolution inhibitor), X is a chromophore moiety such as, for example, bis(t-butyl phenyl) iodonium, tris (t-butyl phenyl) sulfonium, or 2-trifluoromethyl 6-nitrobenzyl. In these embodiments R', R", R'", and R"" are selected so that the amino moiety, —R'"—Y, is a sufficiently strong enough base to neutralize the photoacid generated from the other PAG in the resist material. Also, in these embodiments, the basicity of the amino moiety is neutralized when the amino-containing compound undergoes photolysis (i.e. the aminosulfonate moiety is cleaved from the chromophore moiety). One example of a suitable photoactive non-PAG amino-containing compound is bis(t-butylphenyl) iodonium cysteate wherein R'" is —CH$_2$CHCO$_2$– and Y is —NH$_3$+. Another example is bis(t-butyl phenyl) iodonium cyclamate wherein n is zero (i.e. there is no R'" moiety present) and and one of R' and R" is hydrogen and the other is cyclohexyl.

In the embodiments of the present invention wherein the substituted amino-containing compound is not photoactive and not a PAG, X is a positively charged onium cation such as, for example, dicyclohexylammonium that does not decompose at either the operating temperature of the resist or at the wavelength of the exposing radiation. In these embodiments, the resist material contains a PAG in addition to the substituted amino-containing compound. One example of a suitable non-photoactive, non-PAG is dicyclohexyl ammonium cyclamate.

In the embodiment of the present invention wherein the substituted amino-containing compound is a PAG, it is advantageous if the polymer has pendant acid labile groups with a low activation energy. In the context of the present invention, a low activation means that the acid labile group is cleaved from the polymer by an acidic moiety with a pK$_a$ in water of at least about 0 but that does not exceed about 6. Examples of acid labile groups with a low activation energy include acetal moieties, ketal moieties, and bis (trimethylsilylmethyl)methyl moieties. Examples of suitable polymers with these moieties include polymers of hydroxystyrene in which at least a portion of the hydroxyl (OH) functionality is protected by moieties which cleave from the polymer in the presence of acid. These polymers contain the following moieties:

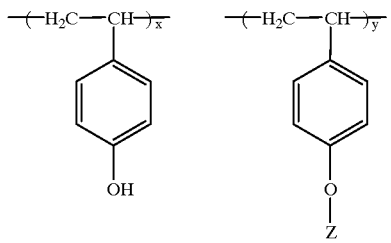

wherein Z denotes the acid sensitive moiety. These polymers are described in U.S. Ser. No. 08/767,493 filed Dec. 16, 1996 to Houlihan et al., which is hereby incorporated by reference.

Examples of suitable Z moieties have the following structure:

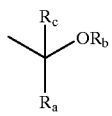

wherein $R_a$ and $R_c$ are selected from the group consisting of hydrogen, methyl, ethyl, t-butyl, and other alkyl moieties or cycloalkyl moieties wherein the number of carbon atoms is eight or less, and $R_b$ is selected from the group consisting of methyl, ethyl, t-butyl, isopropyl and other alkyl moieties or cycloalkyl moieties wherein the number of carbon atoms is eight or less. In the acetal moieties, one of either $R_a$ or $R_c$ are hydrogen. In the ketal moieties, neither $R_a$ nor $R_c$ are hydrogen. Other non-styrene based polymer matrices in which a base-soluble polymer matrix is partially protected with a low activation energy group are also contemplated as suitable.

The selection of R''' will affect the $pK_a$ of the acidic moiety generated by the substituted amino-containing PAG. For example, the $pK_a$ in water of the acidic moiety generated from $HSO_3CH_2NH_2$ (wherein n is equal to one and R''' is methylene) is about 5.75. However, the $pK_a$ in water of the acidic moiety generated from $HSO_3CH_2CH_2NH_2$ (wherein n is equal to one and R''' is ethylene) is about 9.06. The $pK_a$ of the acidic moiety generated from the substituted amino-containing PAG with a phenylene (PH) spacer is suitably low (e.g., the $pK_a$ of $HSO_3PHNH_2$ is 3.23). However, the presence of the aromatic phenylene moiety (or other moieties with unsaturated carbon—carbon bonds) in the PAG restrict the use of such PAGs when the wavelength of the exposing radiation is less than about 200 nm. This restriction results from the fact that the unsaturated carbon bonds (excluding the chromophore X), in most applications, have an unacceptably high light absorption at wavelengths less than 200 nm. However, if the PAG containing the unsaturated carbon bonds (excluding the chromophore X) were combined with another PAG in relative amounts that would effectively dilute the light absorption of the unsaturated carbon bonds to acceptable levels, then such a combination would be suitable for use in processes in which the exposing radiation is less than about 200 nm. In this regard, a PAG combination wherein the amount of the PAG containing the unsaturated carbon bonds is less than about 0.5 weight percent (based upon the weight of the polymer) is contemplated as suitable.

In the process, the energy-sensitive material is selectively exposed to radiation with a wavelength in the range of about 190 nm to about 370 nm to form an image of a desired pattern in the energy-sensitive material. That pattern is then developed and used in subsequent processing. Because the dissolution inhibitors described herein do not significantly absorb radiation at 193 nm, the dissolution inhibitors are particularly advantageous if used in lithographic processes in which the exposing radiation has a wavelength of about 193 nm.

Consequently, it is advantageous if the polymer in the resist material is compatible with lithographic process for device fabrication in which the exposing radiation is about 190 nm to about 370 nm. Polymers contemplated for use in the process of the present invention include acrylate-based resins that are soluble in aqueous base solution. Examples of such acrylate-based resins are described in the previously-mentioned article Allen, R. D., et al., " ACS Symposium Series, Vol. 614, chap. 17, p. 255 (1995). Other examples of suitable polymers include the polymers with saturated alicyclic moieties described in U.S. Ser. No. 08/803,703 now U.S. Pat. No. 5,843,624 filed Mar. 6, 1996.

In the embodiment wherein the resist material is used in a lithographic process in which the wavelength of the exposing radiation has a wavelength of about 193 nm, the amount of PAG depends upon the composition of the PAG. If the PAG contains an aromatic moiety in the chromophore X, it is advantageous if the amount of PAG in the resist material is about 0.5 to about 4 weight percent, because the aromatic unsaturation in these moieties absorbs radiation at this wavelength. In other embodiments wherein radiation of a different wavelength is used, or where a PAG which does not absorb a lithographically significant amount of the exposing radiation is used, more PAG, about 1 weight percent to about 20 weight percent, is incorporated into the resist material.

The photoacid cleaves the acid labile groups from either the polymer or the dissolution inhibitor, typically during a post-exposure bake. The cleavage of these groups from the polymer causes the exposed resist material to be more soluble than the unexposed resist material in aqueous base solution. An aqueous base developer solution is then used to dissolve and remove the exposed resist material. The unexposed resist material is then used as a patterned mask for subsequent processing of the underlying substrate; typically for pattern transfer into the substrate.

In the above-described embodiments, the solubility of the resist composition in aqueous base solution is altered when the resist material is exposed to radiation. Since the resist materials of the present invention are positive resists, the aqueous base solubility of the exposed resist is greater than the aqueous base solubility of the resist that is not exposed to radiation. If the ratio of the rate of dissolution of the resist before irradiation compared to that after irradiation is taken as 1:n, n should be not be less than 2. Relative solubility ratios with values of n less than 2 typically produce low contrast and inferior image quality.

An appropriate optical density in the wavelength range of the exposing radiation significantly enhances resist quality. Too low an optical density results in inefficient absorption of the exposing radiation and in unnecessarily long exposure times. Too high an optical density does not permit sufficient light to reach the regions of the polymer film furthest removed from its ambient/resist film interface. This incomplete exposure tends to degrade resist image quality. In general, it is desirable to employ an optical density that is preferably less than 0.7 A.U./μm for at least 23 percent of the exposing radiation to reach the substrate at the exposure wavelength.

The optical density depends on the concentration of the absorbing species in both the polymer and the PAG. Thus, once a suitable thickness for the resist material coating is chosen, the resist composition is adjusted to provide the desired optical density. For thicknesses as previously discussed in connection with film continuity, if the desired optical density is maintained, useful results are attained.

In the process of the present invention, generally, the resist material described generally above, is formed into a film on the surface of a substrate that is typically a silicon wafer. The silicon wafer will typically have layers of other materials formed thereon. These wafers, with or without layers of other materials formed thereon, are referred to herein as substrates.

The thickness of the film depends upon a variety of factors such as the absorption of the resist, the quality of the film, and the effect of thickness on image resolution. Typically, the thickness of the resist film is in the range of about 0.2 μm to about 2 μm.

After coating, the resist is preferably prebaked to remove any remaining solvent. Pre-exposure baking temperatures in the range of 70° C. to 160° C. for times in the range of about 0.5 to about 60 minutes are desirable. The resist material is then exposed to energy such as ultraviolet radiation with a wavelength of about 190 nm to about 370 nm. Typical doses in the range of 5 to 250 mJoules/cm$^2$ for 193 nm light are contemplated as suitable. Conventional exposure techniques are employed to delineate the resist material. One skilled in the art will appreciate that the selection of a suitable exposure dose will depend upon the particular resist material that is used, as well as other process variables.

It is then desirable to post exposure bake the exposed material. This post-bake enhances the reaction of, depending upon the particular embodiment, the relatively insoluble dissolution inhibitor and, if applicable, polymer, with the photoacid. Generally, post-bake temperatures in the range of about 70° C. to about 160° C. for time periods of about 20 seconds to about 30 minutes are effective. Heating means such as a hot plate sold by Brewer Sciences are contemplated as useful.

Solvents suitable for developing the exposed image are materials such as water/tetramethylammonium hydroxide, water/NaOH, or water and base with lower alkyl alcohols such as isopropanol, ethanol, methanol, and mixtures thereof. Generally, immersion in the developer for time periods from 10 seconds to 5 minutes produces the desired delineation.

After the development, the pattern in the resist is transferred into the underlying substrate using conventional etching expedients well known to one skilled in the art.

The following examples are provided to further illustrate exemplary embodiments of the present invention. The examples are not intended by way of limitation, except within the spirit and scope of the appended claims.

EXAMPLE 1

Bis(4-tert-butylphenyl)iodonium chloride (2.144 g; 5 mmol) was dissolved in methylene chloride (100 mL) and washed four times in a separatory funnel with a solution of sodium cyclamate (1.5 g) dissolved in water (30 mL). The methylene chloride was removed from the solution and the residue was recrystallized using a mixture of ethyl acetate and ether to obtain bis(4-tert-butylphenyl)iodonium cyclamate (1.59 g).

EXAMPLE 2

Resist materials were prepared by combining a polyhydroxystyrene polymer in which about 32 percent of the hydroxy functionality is replaced with an acetal derived from t-butylvinyl ether with a PAG. The polyhydroxystyrene polymer (VP-8000 obtained from Nisso) was protected using the method described in Mertesdorf, C., et al., "Structural Design of Ketal and Acetal Blocking Groups in 2-Component Chemically Amplified Positive DUV-Resists, *SPIE*, Vol. 2438 pp. 84–98 (1996) which is hereby incorporated by reference.

Resist formulations were prepared by dissolving the protected polymer (8.774 g) in propylene glycol ether (41 mL) obtained from Aldrich Chemicals. Several different resist formulations were prepared by adding different PAGs and mixtures of PAGs to the dissolved polymer. A separate dissolved polymer solution was prepared and used for each formulation. For convenience, each formulation is assigned a number for reference herein.

Resist formulation 1 was prepared by adding bis(tert-butylphenyl)iodonium cyclamate (0.09 g; 1 weight percent) to the dissolved polymer. After complete dissolution, the solution was filtered through 0.2 μm Teflon filters (Millipore, Inc.).

Resist formulation 2 was prepared by adding bis(tert-butylphenyl)iodonium cyclamate (0.225 g; 2.5 weight percent) to the dissolved polymer. After complete dissolution, the solution was filtered through 0.2 μm Teflon filters (Millipore, Inc.).

Resist formulation 3 was prepared by adding bis(tert-butylphenyl)iodonium cyclamate (0.45 g; 5 weight percent) to the dissolved polymer. After complete dissolution, the solution was filtered through 0.2 μm Teflon filters (Millipore, Inc.).

Resist formulation 4 was prepared by adding bis(tert-butylphenyl)iodonium camphorsulfonate (0.22 g; 2.5 weight percent) to the dissolved polymer. After complete dissolution, the solution was filtered through 0.2 μm Teflon filters (Millipore, Inc.).

Resist formulation 5 was prepared by adding bis(tert-butylphenyl)iodonium 4-methoxybenzenesulfonate (0.2256g; 2.5 weight percent). After complete dissolution, the solution was filtered through 0.2 μm Teflon filters (Millipore, Inc.).

Resist formulation 6 was prepared by adding a mixture of bis(tert-butylphenyl)iodonium cyclamate (0.18 g; 2 weight percent) and bis(tert-butylphenyl)iodonium 4-methoxybenzenesulfonate (0.045 g; 0.5 weight percent). After complete dissolution, the solution was filtered through 0.2 μm Teflon filters (Millipore, Inc.).

Resist formulation 7 was prepared by adding a mixture of bis(tert-butylphenyl)iodonium cyclamate (0.1974 g; 2.1875 weight percent) and bis(tert-butylphenyl)iodonium 4-methoxybenzenesulfonate (0.0282 g; 0.3125 weight percent). After complete dissolution, the solution was filtered through 0.2 μm Teflon filters (Millipore, Inc.).

Silicon wafers were coated with the above-described formulations. Each formulation was applied to a separate wafer using a Machine Technology Incorporated (MTI) model Flexilab track. The spin speed was 3000–3900 rpm to get a nominal resist thickness of about 0.71 μm to about 0.76

μm. The coated wafers were baked at 130° C. for 90 seconds. The resist thickness was measured by a Nanospec AFT thickness gauge using a refractive index of 1.56 (the refractive index of protected poly(hydroxystyrene)).

The coated wafers were then exposed to patterned radiation. The radiation had a wavelength of 248 nm and a dose in the range of 5 to 70 mJ/cm$^2$. The radiation was projected through a mask with a series of six line and space features. Each set in the series consisted of eight lines and spaces. Each set had a different spacing from the center of one line to the center of an adjacent line in the set. Those spacings were 0.35 μm, 0.32 μm, 0.3 μm, 0.27 μm, 0.27 μm, 0.25 μm, and 0.23 μm. The exposure tool used was a GCA XLS KrF excimer laser stepper with a 0.53 NA lens obtained from GCA of Tewksbury, Mass.

After the coated wafers were exposed to radiation, the wafers were baked at 115° C. for 90 seconds. The patterns were developed using a 10 second spray and 55 second puddle of OPD-4262 (0.262N tetramethyl ammonium hydroxide) (OPD is Olin Microelectronics Materials, Inc., of East Providence, R.I.) on an MTI track. The linewidths were measured on a Hitachi S-600 CD-SEM and cross section profiles were obtained by a JEOL 6400 F SEM.

The clearing dose and the resolution dose of formulations 1–7 are reported in Table 1 below.

TABLE 1

| Resist Formulation | PAG Loading (wt. %) | Clearing Dose mJ/cm$^2$ | Resolution Dose (0.3 μm lines and spaces) |
|---|---|---|---|
| 1 | 1 | 11 | 18 |
| 2 | 2.5 | 7.5 | 11 |
| 3 | 5 | 5.5 | 19 |
| 4 | 2.5 | <1 | lost by erosion |
| 5 | 2.5 | <1 | lost by erosion |
| 6 | 2.5 | 6 | 12 |
| 7 | 2.5 | 6 | 12 |

Resist formulations 1, 2, and 3, contained the amino-containing compound as a PAG. Resist formulations 4 and 5 did not contain the amino-containing compound of the present invention. Resist formulations 6 and 7 contained the amino-containing compound in combination with the PAG used in resist formulation 5. The features developed in resist material formulations (4 and 5) that did not contain the substituted amino-containing PAG were lost due to line slimming. The features developed in the resist material formulations that contained the substituted amino-containing PAG, either alone or in combination with another PAG, were not lost to line slimming. Also, although the features developed in resist formulation 5 were lost to erosion, the features developed in formulation 6 (which contained a combination of the amino-containing compound and the PAG present in formulation 5) were not so eroded. Clearly the amine-containing compound of the present invention reduces feature erosion when added to resist formulations.

EXAMPLE 3

A copolymer of norbornene, maleic anhydride, t-butyl acrylate and acrylic acid was synthesized according to the following procedure. Norbornene (39.81 g; 423 mmol) was vacuum-transferred into a dry 500 mL Schlenk flask equipped with two PTFE-stoppered inlet valves and an efficient stir-bar. Freshly sublimed maleic anhydride (41.5 g; 423 mmol), distilled t-butyl acrylate (24.4 g; 190 mmol), and distilled acrylic acid (6.86 g; 95 mmol), AIBN (0.695 g; 1 mole percent), and THF (90 mL) were added under positive argon pressure. The mixture was degassed by three freeze-pump-thaw cycles, sealed, and immersed in an oil bath at 65° C. for 20 hours. Upon cooling, the mixture was precipitated into 5 volumes of diethyl ether and filtered to collect the polymer. Upon cooling, the mixture was precipitated into 5 volumes of diethyl ether and filtered to collect the polymer. This process was repeated three more times. The polymer was collected in the final filtration and dried at 50° C. under vacuum. The resulting polymer was poly ((norbornene-alt-maleic anhydride)-t-butylacrylate(45)-acrylic acid(22.5)) wherein the polymer is 22.5 mole percent acrylic acid, 45 mole percent t-butylacrylic acid and 42.5 mole percent an alternating copolymer of norbornene and maleic anhydride.

An oligomer of t-butylcholate and glutarate was synthesized by charging an oven-dried, argon-purged Schlenk tube with t-butylcholate (2 g; 4.457 mmol)(previously dried under vacuum at 60° C. overnight), N-methylmorpholine (3.26 g; 32.2 mmol)(distilled from CaH$_2$), and THF (35 mL). The mixture was cooled to 0° C. and distilled glutaryl dichloride (1.232 mL; 9.654 mmol; 1.632 g) was slowly added using a gas tight syringe. The tube was sealed and heated to 60° C. overnight. The reaction solution was then diluted with methanol (20 percent) and precipitated into water (500 mL) containing acetic acid to neutralize the N-methylmorpholine. The dilution/precipitation was repeated twice. The polymer was recollected by filtration, washed with distilled water and dried in vacuum at 60° C. The yield was 4 g (74 percent yield). The structure of the resulting oligomer was

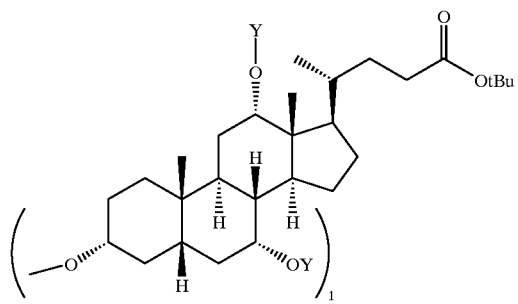

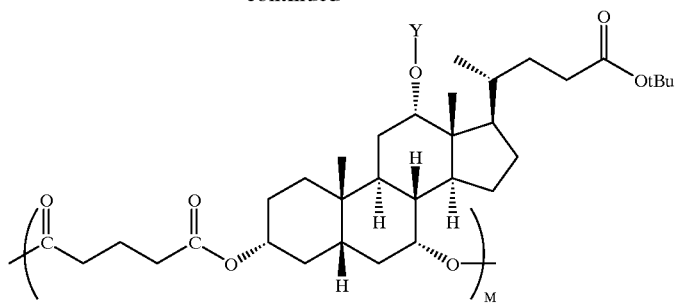
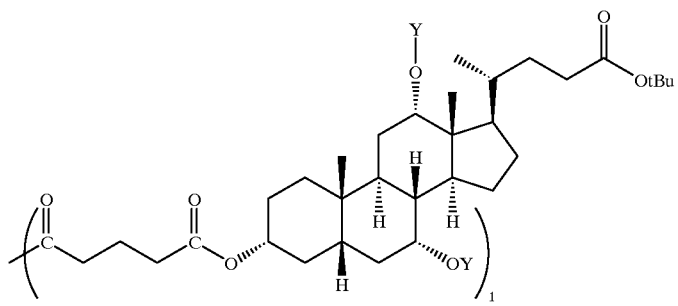

oligo(t-butylcholate-co-glutarate) end-capped with t-butylcholate wherein tBu indicates a tert-butyl substituent and Y indicates either a hydrogen or another unit in the structure defined by the parenthesis and having the subscript M or 1. The number of units M per molecule was about 5 to about 20. As previously noted, the condensation reaction can occur at any OH substituent on the polycyclic compound. Therefore, the condensation reaction product of a cholate (having three hydroxyl substituents) is likely to have a branched structure. The above structure is provided to assist in describing the reaction product, but is not to be construed to depict the actual structure of the product that was obtained.

EXAMPLE 4

Resist formulation 8 was prepared by dissolving poly ((norbomene-alt-maleic anhydride)-t-butylacrylate(45)-acrylic acid(22.5)) (1.173 g), oligo(t-butylcholate-co-glutarate) (0.4795 g), 0.4795 g tert-butyldeoxycholate, bis (4-tert-butylphenyl)iodonium nonaflate (0.0548 g), and bis (4-tert-butylphenyl)iodonium cyclamate (0.01096 g) in propylene glycol methyl ether acetate (17.26 g). After complete dissolution, the solution was filtered through 0.2 $\mu$m Teflon filters (Millipore, Inc.).

Resist formulation 9 was the same as resist formulation 8 except that dicylcohexylammonium cyclamate (0.0069 g) was added instead of bis(4-tert-butylphenyl)iodonium cyclamate. Dicylcohexylammonium cyclamate was prepared by dissolving cyclamic acid (5 g) in water (10 mL). Dicyclohexylamine (5.059 g; 5.56 mL) was added to the stirred solution. The mixture was stirred overnight. The water and residual amine was removed from the resulting white crystals by vacuum. The crystals were recrystallized three times from methylene chloride/ether.

Resist formulation 10 was the same as resist formulation 8 except that bis(4-tert-butylphenyl)iodonium cyclamate was not included in the formulation.

Silicon wafers were coated with the above-described formulation. The formulation was applied to a separate wafer using a Machine Technology Incorporated (MTI) model Flexilab track. The spin speed was 3000–3900 rpm to get a nominal resist thickness of about 0.71 $\mu$m to about 0.76 $\mu$m. The coated wafers were baked at 130° C. for 90 seconds. The resist thickness was measured by a Nanospec AFT thickness gauge using a refractive index of 1.50 (the refractive index of the formulated resist).

The coated wafers were then exposed to patterned radiation. The radiation had a wavelength of 193 nm and a dose of 5 to 50 mJ/cm$^2$. The radiation was projected through the mask described in Example 2 onto the coated wafers. The exposure tool used was a GCA XLS KrF excimer laser stepper with a 0.53 NA lens obtained from GCA of Tewksbury, Mass.

After the coated wafers were exposed to radiation, the wafers were baked at 150° C. for 60 seconds. The patterns were developed using a 10 second puddle with OPD-4262 (0.262N tetramethyl ammonium hydroxide) (OPD is Olin Microelectronics Materials, Inc., of East Providence, R.I.) on an MTI track. The linewidths were measured on a Hitachi S-600 CD-SEM and cross section profiles were obtained by a JEOL 6400 F SEM. Table 2 summarizes and compares the lithographic performance of formulations 8, 9, and 10.

TABLE 2

| Resist Form-ulation | Clearing Dose at 248 nm (mJ/cm$^2$) | Con-trast | Resolu-tion Dose at 248 nm (mJ/cm$^2$) | Nominal feature size ($\mu$m) | Feature Size ($\mu$m-no delay) | Feature Size ($\mu$m-w/1 hour delay) |
|---|---|---|---|---|---|---|
| 8 | 11 | 7.7 | 22 | 0.35 | 0.33 | 0.33 |
|   |    |     |    | 0.30 | 0.29 | 0.29 |
|   |    |     |    | 0.25 | 0.26 | 0.26 |
| 9 | 16 | 5.7 | 50 | 0.35 | 0.32 | 0.32 |
|   |    |     |    | 0.30 | 0.24 | 0.24 |
|   |    |     |    | 0.25 | 0.20 | 0.20 |
| 10 | 4 | 3.1 | 8 | 0.35 | 0.28 | 0.25 |
|    |   |     |   | 0.30 | 0.25 | 0.22 |

TABLE 2-continued

| Resist Formulation | Clearing Dose at 248 nm (mJ/cm²) | Contrast | Resolution Dose at 248 nm (mJ/cm²) | Nominal feature size (μm) | Feature Size (μm-no delay) | Feature Size (μm-w/1 hour delay) |
|---|---|---|---|---|---|---|
| | | | | 0.25 | not resolved | not resolved |

The features developed in resist formulation 8 did not exhibit detectable erosion for delays up to four hours between exposure and post-exposure bake. In contrast, the features developed in formulation 10 exhibited erosion which was characteristic of acid depletion at the interface between the resist and the air and at the interface between the resist and the underlying silicon substrate. Because of this acid depletion the 0.25 μm features were not resolved.

EXAMPLE 5

Cysteic acid (4.36 g) was dissolved in water (100 mL). While being stirred, silver carbonate (3.215 g) was added to the solution. The solution was stirred until effervescence ceased as the silver carbonate had mostly dissolved. The solution was then filtered to remove the insoluble material therefrom.

A solution of bis(t-butylphenyl) iodonium chloride (10 g) in methylene chloride (25 mL) was added to the filtered solution. The resulting two-phase system was stirred vigorously for four days. After this, the solution was filtered to remove the precipitated silver chloride. The organic phase was separated from the solution, washed with distilled water, dried over magnesium sulfate, and filtered. The solvents were then removed to obtain the crude product. The crude product was precipitated three times form a mixture of methylene chloride and dried under vacuum.

A resist composition was prepared in the manner described in the previous example by combining the following ingredients in the following amounts: poly ((norbornene-alt-maleic anhydride)-t-butylacrylate(45)-acrylic acid(22.5)) (62.96 wt. percent), oligo(t-butylcholate-co-glutarate) (16.95 weight percent), tert-butyldeoxycholate (16.95 weight percent), bis(4-tert-butylphenyl)iodonium nonaflate (1.98 weight percent), and bis(4-tert-butylphenyl) iodonium cysteate (1.17 weight percent).

The resist composition was applied onto a substrate and formed into a film in the manner described in Example 4. The resist composition was then patternwise exposed to radiation at a wavelength of 193 nm. The resolution dose of this formulation was 38 mJ/cm² (compared to 30 mJ/cm² for formulation 8 in the previous example). By way of further comparison, features as small as 0.16 μm can be resolved in both this formulation and formulation 8. The depth of focus in both formulations in 0.5 μm for 0.17 μm features and 0.3 μm for 0.16 μm features.

What is claimed is:

1. A process for device fabrication comprising:

forming a layer of an energy sensitive resist material on a substrate wherein the energy sensitive resist material comprises a polymer and a substituted amino-containing compound having the following structure:

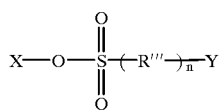

wherein Y is a nitrogen-containing moiety that is either

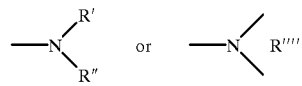

wherein X is selected from the group consisting of chromophores and positively charged onium cations, wherein R' and R" are the same or different and both are selected from the group consisting of hydrogen (H), alkyl groups with about 8 or fewer carbon atoms, cycloalkyl groups, phenyl groups and alkyl ether groups having the following formula:

where y is equal to about 2 or 3 and $R_{aa}$ is either an alkyl group with 5 or fewer carbon atoms or a cycloalkyl group, wherein n is either zero or 1, wherein R''' is selected from the group consisting of alkylene groups with eight or fewer carbon atoms, substituted alkylene groups with eight or fewer carbon atoms, phenylene, and substituted phenylene, wherein R'''' is an alkylene moiety with less than about eight but at least three carbon atoms, and wherein the total number of aromatic groups is one or less;

exposing the layer of energy sensitive resist material to patterned radiation selected from the group consisting of ultraviolet radiation, x-ray radiation, and electron beam radiation thereby introducing an image of the pattern into the resist material;

developing the image into a pattern; and transferring the pattern into the underlying substrate.

2. The process of claim 1 wherein the substituted amino containing compound is a photoacid generator and X is a chromophore selected from the group consisting of bis(t-butyl phenyl)iodonium, tris(t-butyl phenyl) sulfonium, and 2-trifluoromethyl 6-nitrobenzyl.

3. The process of claim 2 wherein R''' is selected from the group consisting of a methylene moiety, a substituted methylene, an ethylene moiety, a substituted ethylene moiety, a phenylene moiety, and a substituted phenylene moiety.

4. The process of claim 3 wherein the substituted amino-containing compound is a photoacid generator and generates an acid when the substituted amino-containing compound is exposed to radiation having a wavelength of about 190 nm to about 370 nm and wherein the $pK_a$ of the acid is about 0 to about 6.

5. The process of claim 4 wherein the $pK_a$ of the acid is about 0 to about 4.

6. The process of claim 4 wherein the polymer has recurrent acid labile substituents pendant thereto wherein the acid labile groups are selected from the group consisting of acetal groups, ketal groups, 1-(trimethylsilylmethyl)methyl, and bis(trimethylsilylmethyl)methyl groups.

7. The process of claim 6 wherein the acetal and ketal groups have the following structure

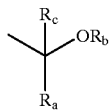

wherein $R_a$, $R_b$ and $R_c$ are selected from the group consisting of hydrogen, alkyl moieties with no more than about eight carbon atoms, cycloalkyl moieties with no more than about eight carbon atoms and wherein the acetal or ketal moiety is linked to the polymer by an oxygen atom.

8. The process of claim 7 wherein the polymer to which the acid labile substituents are pendant is selected from the group consisting of acrylate-based polymers and copolymers, methacrylate-based polymers and copolymers, polymers and copolymers with alicyclic moieties incorporated into the polymer backbone, polymers and copolymers with alicyclic substituents pendant to the polymer backbone, and hydroxystyrene-based polymers and copolymers.

9. The process of claim 6 wherein the amount of polymer in the energy sensitive material is about 80 weight percent to about 99.5 weight percent and the amount of substituted amino-containing photoacid generator is about 0.5 weight percent to about 20 weight percent based upon the combined weight of the polymer and the photoacid generator in the energy sensitive resist composition.

10. The process of claim 4 wherein the energy sensitive resist material further comprises a dissolution inhibitor.

11. The process of claim 10 wherein the dissolution inhibitor has recurrent acid labile substituents pendant thereto wherein the acid labile groups are selected from the group consisting of acetal groups, ketal groups, and bis(trimethylsilylmethyl)methyl groups.

12. The process of claim 11 wherein the acetal and ketal groups have the following structure

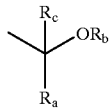

wherein $R_a$, $R_b$ and $R_c$ are selected from the group consisting of hydrogen, alkyl moieties with no more than about eight carbon atoms, cycloalkyl moieties with no more than about eight carbon atoms and wherein the acetal or ketal moiety is linked to the dissolution inhibitor by an oxygen atom.

13. The process of claim 11 wherein the combined amount of polymer and dissolution inhibitor in the energy sensitive material is about 80 weight percent to about 99.5 weight percent and the amount of substituted amino-containing photoacid generator is about 0.5 weight percent to about 20 weight percent based upon the combined weight of the polymer, the dissolution inhibitor and the photoacid generator in the energy sensitive resist composition and wherein the combined amount of polymer and dissolution inhibitor is about 60 weight percent to about 90 weight percent polymer to about 10 to about 40 weight percent dissolution inhibitor.

14. The process of claim 4 wherein the energy sensitive resist material further comprises an amine additive.

15. The process of claim 2 wherein the resist material further comprises a photoacid generator and wherein R', R", R''', and R'''' are selected so that the amino-containing compound is sufficiently basic to neutralize the acid generated by the photoacid generator.

16. The process of claim 15 wherein the wavelength of the exposing radiation is about 190 nm to about 370 nm.

17. The process of claim 16 wherein the polymer has recurrent acid labile substituents pendant thereto wherein the acid labile groups are selected from the group consisting of tert-butyl esters, tert-butyl esters of carboxylic acid, and tert-butyl ethers.

18. The process of claim 17 wherein the polymer to which the acid labile substituents are pendant is selected from the group consisting of acrylate-based polymers and copolymers, methacrylate-based polymers and copolymers, polymers and copolymers with alicyclic moieties incorporated into the polymer backbone, polymers and copolymers with alicyclic substituents pendant to the polymer backbone, and hydroxystyrene-based polymers and copolymers.

19. The process of claim 15 wherein the amount of the substituted amino-containing compound in the energy sensitive is about 0.1 weight percent to about 0.8 weight percent based on the combined weight of the polymer and the photoacid generator in the energy sensitive resist material.

20. The process of claim 1 wherein X is an a positively charged onium cation that does not decompose at either the operating temperature of the resist or at the wavelength of the exposing radiation and wherein the energy sensitive resist material further comprises a photoacid generator that generates an acid when exposed to radiation.

21. The process of claim 20 wherein the wavelength of the exposing radiation is about 190 nm to about 370 nm.

22. The process of claim 21 wherein the polymer has recurrent acid labile substituents pendant thereto wherein the acid labile groups are selected from the group consisting of tert-butyl esters, tert-butyl esters of carboxylic acid, and tert-butyl ethers.

23. The process of claim 22 wherein the polymer to which the acid labile substituents are pendant is selected from the group consisting of acrylate-based polymers and copolymers, methacrylate-based polymers and copolymers, polymers and copolymers with alicyclic moieties incorporated into the polymer backbone, polymers and copolymers with alicyclic substituents pendant to the polymer backbone, and hydroxystyrene-based polymers and copolymers.

24. The process of claim 20 wherein the amount of the substituted amino-containing compound in the energy sensitive is about 0.1 weight percent to about 0.8 weight percent based on the combined weight of the polymer and the photoacid generator in the energy sensitive resist material.

* * * * *